US009395182B1

(12) United States Patent
Yuan et al.

(10) Patent No.: US 9,395,182 B1
(45) Date of Patent: Jul. 19, 2016

(54) METHODS AND SYSTEMS FOR REDUCING CROSSTALK IN AVALANCHE PHOTODIODE DETECTOR ARRAYS

(75) Inventors: Ping Yuan, Simi Valley, CA (US); Joseph Charles Boisvert, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 306 days.

(21) Appl. No.: 13/039,852

(22) Filed: Mar. 3, 2011

(51) Int. Cl.
*G01C 3/08* (2006.01)

(52) U.S. Cl.
CPC ........................................ *G01C 3/08* (2013.01)

(58) Field of Classification Search
CPC ..... G01C 3/08; H01L 31/107; H01L 31/0232
USPC ............ 356/3.01, 4.01, 5.01, 9, 625; 257/432
See application file for complete search history.

(56) References Cited

U.S. PATENT DOCUMENTS

| 4,203,124 | A | | 5/1980 | Gordon et al. |
|---|---|---|---|---|
| 4,250,516 | A | | 2/1981 | Worlock |
| 4,403,397 | A | | 9/1983 | Bottka et al. |
| H000170 | H | * | 12/1986 | Binari ............... H01L 47/02 331/107 R |
| 6,359,322 | B1 | | 3/2002 | Haralson et al. |
| 6,384,462 | B1 | | 5/2002 | Pauchard et al. |
| 6,459,107 | B2 | | 10/2002 | Sugiyama et al. |
| 6,963,089 | B2 | | 11/2005 | Shi et al. |
| 7,082,248 | B1 | | 7/2006 | Morse |
| 7,209,623 | B2 | | 4/2007 | Morse |
| 7,233,051 | B2 | | 6/2007 | Morse et al. |
| 7,248,344 | B2 | | 7/2007 | Morcom |
| 8,279,411 | B2 | * | 10/2012 | Yuan et al. ............... 356/4.01 |
| 2002/0185702 | A1 | * | 12/2002 | Shirai et al. ............... 257/443 |
| 2005/0029541 | A1 | | 2/2005 | Ko |
| 2006/0006309 | A1 | | 1/2006 | Dimsdale et al. |
| 2007/0164385 | A1 | | 7/2007 | Morse et al. |
| 2008/0100822 | A1 | | 5/2008 | Munro |

(Continued)

FOREIGN PATENT DOCUMENTS

WO 2008004547 A1 1/2008

OTHER PUBLICATIONS

Albota, Marius A., et al. "Three-Dimensional Imaging Laser Radars with Geiger-Mode Avalanche Photodiode Arrays". Lincoln Laboratory Journal, vol. 12, No. 2, 2002. http://www.ll.mit.edu/publications/journal/pdf/vol13_no2/13_21aserradars3d.pdf.*

(Continued)

*Primary Examiner* — Luke Ratcliffe
*Assistant Examiner* — Samantha K Abraham
(74) *Attorney, Agent, or Firm* — Armstrong Teasdale LLP

(57) ABSTRACT

A laser detection and ranging (LADAR) system is provided for generating a three-dimensional image of an object. The LADAR system includes a laser source configured to project a laser beam onto the object, and a photodiode detector array configured to detect a reflection of the laser beam projected onto the object. The photodiode detector array includes a back interface, a front interface positioned opposite the back interface, and a passivation region disposed between the back interface and the front interface. The back interface includes at least one window, and the front interface includes at least one active region oriented to detect a photon associated with the reflection. The at least one active region includes an absorber and a multiplier. The filter is configured to have a bandgap between an absorber bandgap and a multiplier bandgap.

17 Claims, 3 Drawing Sheets

(56) References Cited

U.S. PATENT DOCUMENTS

2008/0143997 A1 6/2008 Greenberg et al.
2009/0008738 A1 1/2009 Yuan et al.
2009/0256223 A1 10/2009 Yamamura et al.
2010/0053594 A1 3/2010 Yuan et al.
2010/0284435 A1* 11/2010 Achtenhagen et al. ...... 372/50.1
2011/0169117 A1* 7/2011 McIntosh et al. ............. 257/432

OTHER PUBLICATIONS

"Substrate" Merriam-Webster online. http://www.merriam-webster.com/dictionary/substrate.*

* cited by examiner

METHODS AND SYSTEMS FOR REDUCING CROSSTALK IN AVALANCHE PHOTODIODE DETECTOR ARRAYS

STATEMENT REGARDING FEDERALLY SPONSORED RESEARCH AND DEVELOPMENT

The invention was made with United States Government support under Contract Number HR0011-08-00020 awarded by the Defense Advanced Research Projects Agency. The United States Government has certain rights in this invention.

BACKGROUND

The present disclosure relates generally to three-dimensional (3D) imaging and, more particularly, to methods and systems that facilitate suppressing photon crosstalk between individual pixels of an avalanche photodiode detector array.

Over time, continued operation of a component with one or more defects may reduce performance of the component, and/or lead to component failures. Accordingly, at least some objects are inspected to determine a size and/or shape of all, or a portion, of the object and/or to detect defects that may be present in the object. For example, known gas turbine engine components, such as turbine or compressor blades, are routinely inspected to detect fatigue cracks that may be caused by vibratory, mechanical, and/or thermal stresses induced to the engine. Moreover, some gas turbine engine blades are also inspected to detect deformations, such as platform orientation, contour cross-section, bow and twist along a stacking axis, thickness, and/or chord length, at given cross-sections of the object. Generally, detecting defects within components, as early as possible, facilitates increasing the performance of the system in which the component is incorporated and/or reducing component failures.

One known system for detecting component defects is a laser detection and ranging (LADAR) system. Known LADAR systems may also be used for aerial mapping, surveillance, reconnaissance, and/or target tracking. The LADAR system projects a laser beam onto a surface of a target to enable a 3D image of the surface to be generated. An array of photodiode detectors receive light reflected from the surface of the target, and a series of amplifiers and a processor record the positions and corresponding travel time of light detected by each of the photodiode detectors. From this information, the processor develops a 3D image of the surface of the target.

Known LADAR systems can operate in the short wavelength infrared (SWIR) region to enable a target to be precisely identified under low-light-level conditions. An avalanche photodiode (APD) focal plane array (FPA) is one example of a LADAR system that is capable of single-photon level detection and imaging. In order to achieve a high sensitivity to incident photons, the APD pixels of known LADAR systems are biased close to, or even beyond, a nominal breakdown voltage. With such an electric field, a single carrier injected into a depleted multiplication layer of the APD pixel may trigger an avalanche breakdown, producing electrons and/or holes, resulting in an avalanche current. With many photo-generated carriers in the multiplication layer, a secondary photon emission may be generated and undesirably captured by other biased pixels in the array.

BRIEF DESCRIPTION

In one aspect, a method is provided for generating a three-dimensional image using a photodiode detector array. The method includes orienting at least one active region to detect a photon transmitted through at least one window. The at least one active region includes an absorber and a multiplier. A photon is absorbed using a filter positioned between the at least one active region and the at least one window. The filter is configured to have a bandgap between an absorber bandgap and a multiplier bandgap. The image is generated based on at least the detection of the photon transmitted through the at least one window.

In another aspect, a photodiode detector array is provided for use in generating a three-dimensional image. The photodiode detector array includes a back interface, a front interface positioned opposite the back interface, and a filter disposed between the back interface and the front interface. The back interface includes at least one window, and the front interface includes at least one active region oriented to detect a photon transmitted through the at least one window. The at least one active region includes an absorber and a multiplier. The filter is configured to absorb a photon having a bandgap between an absorber bandgap and a multiplier bandgap.

In yet another aspect, a laser detection and ranging (LADAR) system is provided for generating a three-dimensional image. The LADAR system includes a laser source configured to project a laser beam onto an object being examined, and a photodiode detector array configured to receive a reflection of the laser beam projected onto the object. The photodiode detector array includes a back interface, a front interface positioned opposite the back interface, and a filter disposed between the back interface and the front interface. The back interface includes at least one window, and the front interface includes at least one active region oriented to detect a photon associated with the reflection. The at least one active region includes an absorber and a multiplier. The filter is configured to have a bandgap between an absorber bandgap and a multiplier bandgap.

The features, functions, and advantages described herein may be achieved independently in various embodiments of the present disclosure or may be combined in yet other embodiments, further details of which may be seen with reference to the following description and drawings.

DETAILED DESCRIPTION

The subject matter described herein relates generally to a three-dimensional (3D) imaging system and, more particularly, to methods and systems for use in reducing photon crosstalk between the pixels of an avalanche photodiode detector array. In one embodiment, a laser detection and ranging (LADAR) system includes a laser source that projects a laser beam onto an object being examined. In such an embodiment, a photodiode detector array detects the reflection of the laser beam for use in generating a 3D image. More specifically, in such an embodiment, the photodiode detector array includes a window, through which the reflection is transmitted, and an active region that is oriented to receive the reflection transmitted through the window. The filter is positioned between the window and the active region to absorb a photon outside the operation spectrum, for example, from a secondary emission. For example, the photon may have a wavelength that is shorter than an operational wavelength of the photodiode detector array. As such, the filter facilitates reducing photon crosstalk between adjacent active regions of the photodiode detector array.

As used herein, the term "crosstalk" refers to a false detection induced by a detection in an adjacent pixel. In one embodiment, crosstalk occurs due to a generation, propagation, and/or detection of a secondary photon emission. The term "bandgap" refers to an energy range in which no electron states can exist in a solid. The energy of a photon measured in electron volts (eV) is equal to Planck's constant ($h=4.13566733 \times 10^{-15}$ eV s) multiplied by the speed of light ($c=2,99,792,458$ m/s) and divided by a wavelength of the photon measured in meters (m). That is, the energy of a photon (eV) is approximately equal to 1.240 divided by the wavelength of the photon measured in micrometers (μm).

An element or step recited in the singular and proceeded with the word "a" or "an" should be understood as not excluding plural elements or steps unless such exclusion is explicitly recited. Moreover, references to "one embodiment" of the present invention and/or the "exemplary embodiment" are not intended to be interpreted as excluding the existence of additional embodiments that also incorporate the recited features.

Figure 1:
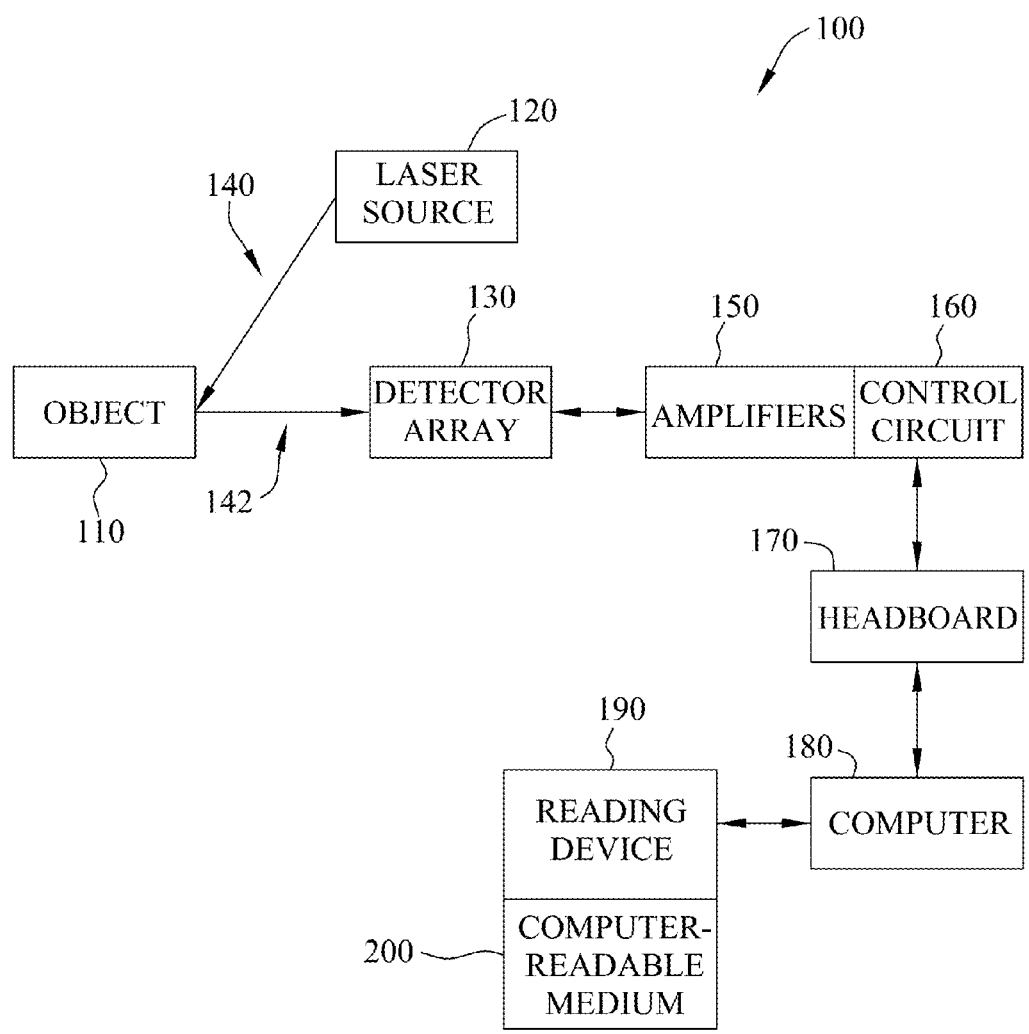
FIG. 1 is a block diagram of an exemplary laser detection and ranging (LADAR) system.

FIG. 1 is a block diagram of an exemplary LADAR system 100 that may be used to measure a plurality of surface features of an object 110 in three dimensions (3D). For example, system 100 may be used to inspect surfaces of object 110 to detect, without limitation, tilts, cracks, bends, twists, and/or warps.

In the exemplary embodiment, system 100 includes a laser source 120 and a photodiode detector array 130. More specifically, in the exemplary embodiment, laser source 120 emits a laser beam or an optical pulse 140, and photodiode detector array 130 detects light including, without limitation, a reflected pulse 142 associated with optical pulse 140. In the exemplary embodiment, laser source 120 is positionable to illuminate at least a portion of object 110 with optical pulse 140, and photodiode detector array 130 is positionable to detect reflected pulse 142 transmitted from object 110.

In the exemplary embodiment, photodiode detector array 130 is an avalanche photodiode (APD) focal plane array (FPA) that operates in the short wavelength infrared (SWIR) region (1.0-1.6 μm). Accordingly, photodiode detector array 130 includes, without limitation, indium gallium arsenide (InGaAs), indium gallium arsenide phosphide (InGaAsP), indium phosphide (InP), and/or indium aluminum arsenide (InAlAs) having a bandgap between approximately 0.75 eV and 1.42 eV at room temperature. Alternatively, photodiode detector array 130 may be any sensor that enables system 100 to function as described herein.

In the exemplary embodiment, reflected pulse 142 detected by photodiode detector array 130 includes a plurality of photons (not shown). In the exemplary embodiment, a sensitivity of photodiode detector array 130 may be selectively adjusted to detect a single photon (not shown) of the plurality of photons. In the exemplary embodiment, photodiode detector array 130 is impinged by the single photon of reflected pulse 142 and produces a signal corresponding to a detection of the single photon of reflected pulse 142.

In the exemplary embodiment, a series of amplifiers 150 and a control circuit 160 are coupled to photodiode detector array 130 to provide photodiode detector array 130 with, for example, biasing voltages, and/or to produce an amplified signal that corresponds to the detection of the single photon of reflected pulse 142. In the exemplary embodiment, the amplified signal is transmitted to a readout integrated circuit (IC) and headboard 170. A transmit time between an emission of optical pulse 140 from laser source 120 and the detection of the single photon of photodiode detector array 130 is calculated. Ranging information for each image pixel is then calculated based on the transmit time.

In the exemplary embodiment, a computer 180 may be utilized to display information to an operator. In one embodiment, computer 180 includes a reading device 190, for example, a floppy disk drive, CD-ROM drive, DVD drive, magnetic optical disk (MOD) device, and/or any other digital device including a network connecting device, such as an Ethernet device, for reading instructions and/or data from a computer-readable medium 200, such as a floppy disk, a CD-ROM, a DVD, and/or another digital source such as a network or the Internet, as well as yet to be developed digital means.

Alternatively, computer 180 may execute instructions stored in firmware. Computer 180 is programmed to perform functions described herein, and as used herein, the term "computer" is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein.

Figure 2:
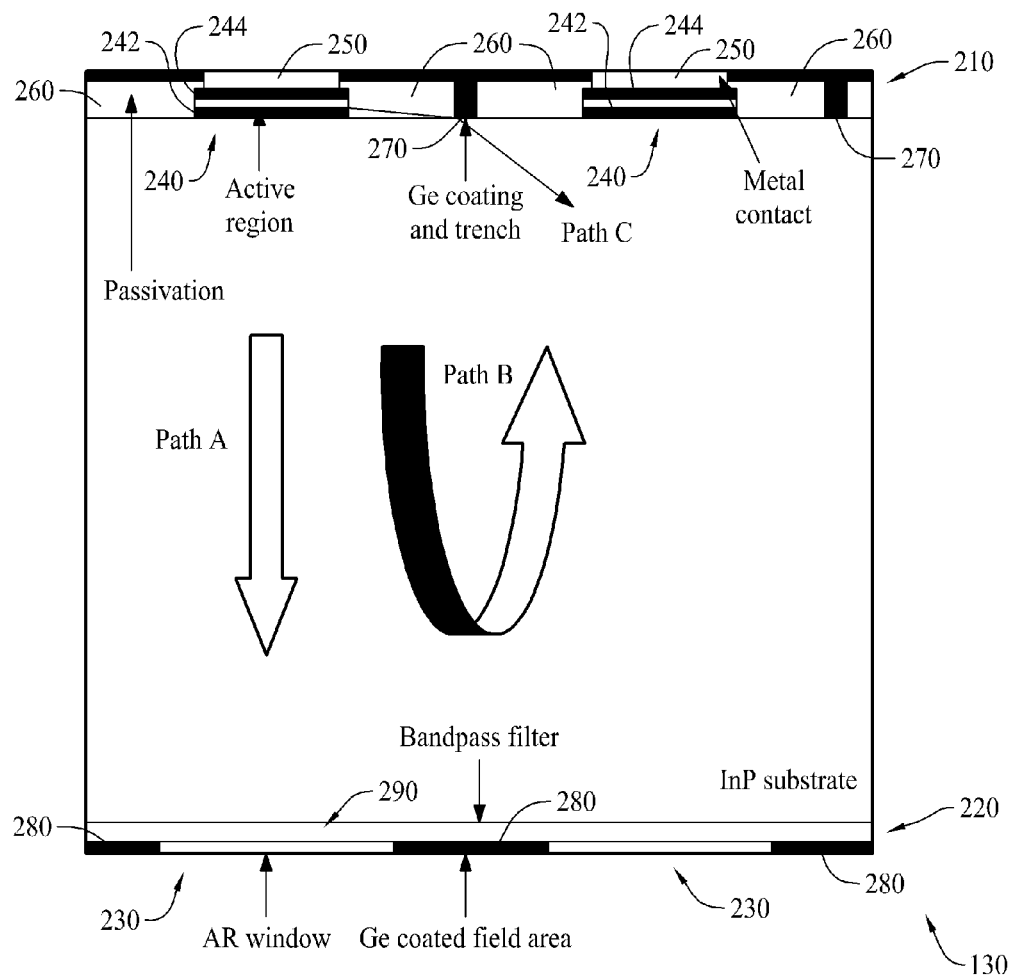
FIG. 2 is a cross-sectional view of an exemplary photodiode detector array including crosstalk reduction features that may be used with the LADAR system shown in FIG. 1.

FIG. 2 is a cross-sectional view of photodiode detector array 130. In the exemplary embodiment, photodiode detector array 130 has a front interface 210 and a back interface 220. For convenience of packaging, in the exemplary embodiment, photodiode detector array 130 is back-illuminated and includes at least one optical window 230 that extends through back interface 220. In the exemplary embodiment, optical window 230 is sized and/or oriented to enable photons to enter photodiode detector array 130. Moreover, in the exemplary embodiment, front interface 210 includes at least one pixel or active region 240. Active region 240 may be processed, for example, from an epitaxial structure grown on a semiconductor substrate. In the exemplary embodiment, active region 240 includes a photodiode absorber 242 that is configured to absorb at least one incident photon, and a photodiode multiplier 244 that is configured to multiply a current produced by incident light enabling individual photons to be detected.

In the exemplary embodiment, photodiode detector array 130 detects reflected laser pulse 142 including a plurality of photons to enable an image of object 110 to be created. Unintended photon detection such as, for example, a detection of secondary photon emissions may disrupt system 100 from obtaining a clear image of object 110. In the exemplary embodiment, the secondary photon emissions have a wavelength that is shorter than an operational wavelength of photodiode absorber 242 and/or that is substantially similar to a wavelength corresponding to a bandgap of multiplier 244. The operational spectrum is defined by the photodiode absorber bandgap and the wide bandgap materials in the optical path. In the exemplary embodiment, the semiconductor substrate has a wider bandgap than the photodiode absorber bandgap.

In practice, in the exemplary embodiment, there are three paths for secondary photon emissions to be transmitted from an active region 240 to an adjacent active region 240. For example, in a first path, a secondary photon emission may escape, for example, active region 240 and scatter or propagate upward towards front interface 210. In the exemplary embodiment, a metal contact 250 substantially covers active region 240 to facilitate effectively blocking the secondary photon emission and/or stray light in the first path and/or to facilitate reflecting the secondary photon emission towards back interface 220.

In a second path, a secondary photon emission may escape, for example, active region 240 and propagate laterally through a passivation region 260. In such an embodiment, passivation region 260 may include a photon-absorbing substance such as, for example, InP to facilitate effectively absorbing the secondary photon emission in the second path and/or facilitate deflecting the secondary photon emission and/or stray light from, for example, an adjacent active region 240.

Moreover, in the exemplary embodiment, passivation region 260 is divided by a trench 270 that is coated with a photon-absorbing material such as, for example, germanium (Ge) to facilitate effectively absorbing the secondary photon emission in the second path. Trench 270 may be coated with the photon-absorbing material on either side and/or both sides and/or include the photon-absorbing material within trench 270. Passivation region 260 and/or trench 270 may include any substrate and/or material that enables passivation region 260 and trench 270 to function as described herein.

In a third path, a secondary photon emission may escape active region 240, travel towards back interface 220, and reflect back towards an adjacent active region 240. In the exemplary embodiment, optical window 230 is coated with a broadband anti-reflective coating to facilitate reducing the reflection of the secondary photon emission and/or stray light from optical window 230.

Moreover, in the exemplary embodiment, a field 280 is positioned between adjacent optical windows 230 to facilitate effectively absorbing the secondary photon emission in the third path. In the exemplary embodiment, field 280 is coated with a photon-absorbing material such as, for example, Ge.

Furthermore, in the exemplary embodiment, a photon-absorbing region or filter 290 extends across at least a portion of back interface 220. More particularly, in the exemplary embodiment, filter 290 extends substantially across an entire area of back interface 220 and has a substantially uniform thickness to facilitate reducing an amount of secondary photon emission and/or stray light that escapes through optical window 230. More specifically, in the exemplary embodiment, filter 290 is configured to have a bandgap between that of absorber 242 and that of multiplier 244 such that an incident signal may pass through filter 290 with little or no loss and the secondary photon emission may be effectively absorbed. That is, in order to reduce the secondary emission, a bandpass filter 290 with a bandgap between that of absorber 242 and that of multiplier 244 is inserted between front and interfaces 210 and 220.

For example, in one embodiment, bandgaps of InP and InAlAs are approximately 1.35 eV and 1.43 eV, respectively, and an exemplary operational wavelength of photodiode detector array 130 is between approximately 1.06 and 1.55 µm, or have an energy between approximately 0.80 and 1.17 eV. In such an embodiment, a suitable bandpass material such as, without limitation, silicon (Si) may be used to form filter 290 because Si is configured to absorb secondary photon emissions between 1.20 eV and 1.43 eV.

Figure 3:
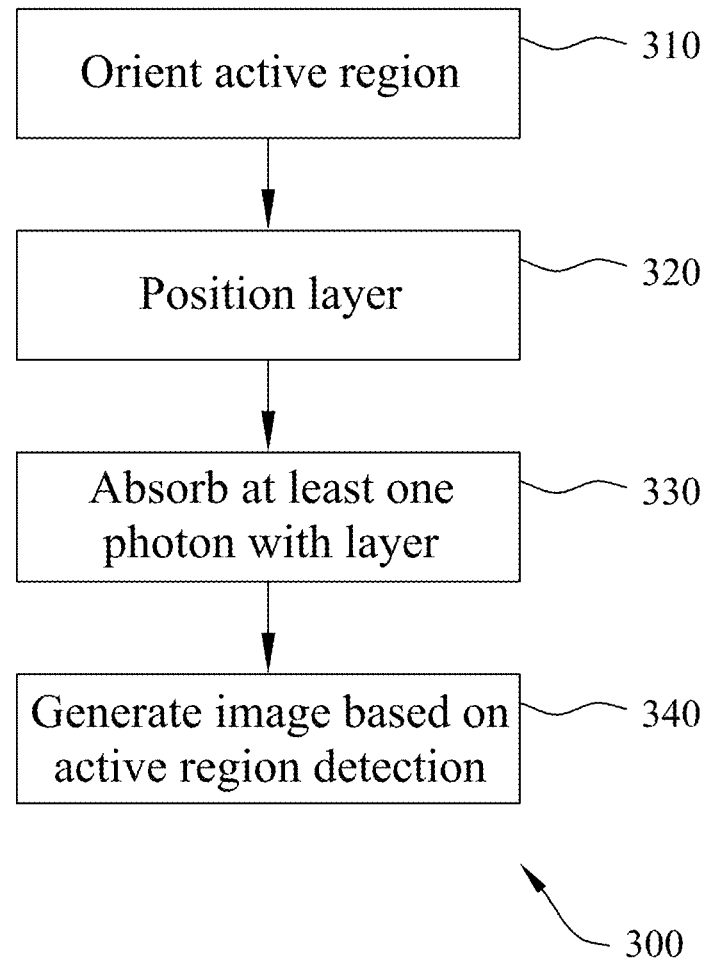
FIG. 3 is a flowchart illustrating an exemplary method of fabricating the photodiode detector array shown in FIG. 2.

FIG. 3 is a flowchart illustrating an exemplary method 300 of generating a three-dimensional image using photodiode detector array 130. In the exemplary embodiment, method 300 includes orienting 310 active region 240 within photodiode detector array 130. More specifically, at least one active region 240 is oriented 310 to detect a photon transmitted through optical window 230. In the exemplary embodiment, filter 290 is positioned 320 between active region 240 and optical window 230. More specifically, and as described above, in the exemplary embodiment, filter 290 absorbs 330 a photon with a wavelength shorter than an operational wavelength of photodiode detector array 130. In the exemplary embodiment, the three-dimensional image is generated 340 based on at least the detection of the photon transmitted through optical window 230. That is, filter 290 absorbs at least some photons reflected within photodiode detector array 130 such that active region 240 selectively receives at least one desired photon transmitted through optical window 230.

The above-described embodiments facilitate reducing crosstalk by incorporating an absorbing layer between an active region and an optical window. As such, the absorbing layer facilitates reducing a detection of secondary emissions, which may result in a reduction of ghosting images due to the reflection and/or scattering of the secondary emission in the lens system. Accordingly, the photodiode detector arrays described herein enable a quality of the images generated by the LADAR system to be increased in a cost-effective and reliable manner.

Exemplary embodiments of systems and methods for facilitating a reduction in optical crosstalk are described above in detail. The systems and methods are not limited to the specific embodiments described herein, but rather, components of systems and/or steps of the method may be utilized independently and separately from other components and/or steps described herein. Each component and each method step may also be used in combination with other components and/or method steps. Although specific features of various embodiments may be shown in some drawings and not in others, this is for convenience only. Any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of generating a three-dimensional image using a photodiode detector array comprising a substrate, a front interface, and a back interface opposite the front interface, oriented such that the substrate is between the front and the back interfaces, the back interface having a first layer and a second layer, said method comprising:

orienting a first active region and a second active region along the front interface to detect a first photon transmitted through a first window or a second window, the first window and the second window defined in the second layer of the back interface, the first active region and the second active region each including an absorber having an absorber bandgap and a multiplier having a multiplier bandgap;

absorbing a second photon using a filter formed from a first material having a bandgap between the absorber bandgap and the multiplier bandgap, the filter positioned in the first layer of the back interface and between the substrate and the second layer, the substrate positioned between the filter and an anode of the photodiode detector array;

absorbing a third photon using a field positioned in the second layer of the back interface, and further positioned between the first window and the second window, wherein the field is coated with a second material that is different from the first material; and generating the image based on at least the detection of the first photon transmitted through the first window or the second window.

2. A method in accordance with claim 1, wherein absorbing the second photon further comprises providing the filter to be sized to extend substantially across an entire area of the back interface, wherein the filter is directly coupled to the first window and the second window, and wherein a thickness of the filter is substantially uniform across the entire area.

3. A photodiode detector array for use in generating a three-dimensional image, said photodiode detector array comprising:
   a substrate;
   a back interface comprising;
      a first layer comprising a filter formed from a first material having a bandgap between an absorber bandgap and a multiplier bandgap for said photodiode detector array; and
      a second layer comprising:
         a first window and a second window; and
         a field coated with a second material that is different from said first material, wherein said field is positioned between said first window and said second window, and wherein said field is configured to absorb a secondary photon emission,
      wherein said first layer is positioned between said substrate and said second layer, wherein said substrate is positioned between said first layer and an anode of the photodiode detector array;
   a front interface positioned opposite said back interface, said front interface comprising a first active region and a second active region, each of said first active region and said second active region being oriented to detect a photon transmitted through said first window or said second window, each of said first active region and said second active region comprising an absorber and a multiplier; and
   a passive region disposed between said first active region and said second active region, said passive region configured to at least one of absorb the secondary photon emission and deflect the secondary photon emission away from said first active region and said second active region.

4. A photodiode detector array in accordance with claim 3, wherein said filter extends substantially across an entire area of said back interface.

5. A photodiode detector array in accordance with claim 3, wherein said filter has a thickness that is substantially uniform across a width of said filter.

6. A photodiode detector array in accordance with claim 3, wherein said filter is configured to absorb a photon having an energy between 1.20 eV and 1.43 eV.

7. A photodiode detector array in accordance with claim 3, wherein said first window and said second window are coated with an anti-reflective coating.

8. A photodiode detector array in accordance with claim 3 further comprising a first metal contact oriented to substantially cover said first active region and a second metal contact oriented to substantially cover said second active region, said first metal contact and said second metal contact being configured to at least one of block the secondary photon emission and reflect the secondary photon emission towards said back interface.

9. A photodiode detector array in accordance with claim 3, wherein said passive region is divided by a trench configured to absorb the secondary photon emission.

10. A photodiode detector array in accordance with claim 3, wherein the field does not extend across said first window or said second window.

11. A laser detection and ranging (LADAR) system for use in generating a three-dimensional image, said LADAR system comprising:
    a laser source configured to project a laser beam onto an object being examined; and
    a photodiode detector array configured to receive a reflection of the laser beam projected onto the object, said photodiode detector array comprising:
       a substrate;
       a back interface comprising;
          a first layer comprising a filter formed from a first material having a bandgap between an absorber bandgap and a multiplier bandgap for said photodiode detector array; and
          a second layer comprising:
             a first window and a second window; and
             a field coated with a second material that is different from said first material, wherein said field is positioned between said first window and said second window, and wherein said field is configured to absorb a secondary photon emission,
          wherein said first layer is positioned between said substrate and said second layer, wherein said substrate is positioned between said first layer and an anode of the photodiode detector array;
       a front interface positioned opposite said back interface, said front interface comprising a first active region and a second active region oriented to detect a photon associated with the reflection, each of said first active region and said second active region comprising an absorber and a multiplier; and
       a passive region disposed between said first active region and said second active region, said passive region configured to at least one of absorb the secondary photon emission and deflect the secondary photon emission away from said first active region and said second active region.

12. A LADAR system in accordance with claim 11, wherein said filter extends substantially across an entire area of said back interface.

13. A LADAR system in accordance with claim 11, wherein said filter has a thickness that is substantially uniform across a width of said filter.

14. A LADAR system in accordance with claim 11, wherein said filter is configured to absorb a photon having an energy greater than approximately 1.20 eV.

15. A LADAR system in accordance with claim 11, wherein said first window and said second window are coated with an anti-reflective coating.

16. A LADAR system in accordance with claim 11, wherein said photodiode detector array further comprises a first metal contact oriented to substantially cover said first active region and a second metal contact oriented to substantially cover said second active region, each of said first metal contact and said second metal contact being configured to at least one of block the secondary photon emission and reflect the secondary photon emission towards said back interface.

17. A LADAR system in accordance with claim 11, wherein said passive region is divided by a trench configured to absorb the secondary photon emission.

\* \* \* \* \*